United States Patent
Gossner et al.

(10) Patent No.: US 6,194,764 B1
(45) Date of Patent: Feb. 27, 2001

(54) INTEGRATED SEMICONDUCTOR CIRCUIT WITH PROTECTION STRUCTURE FOR PROTECTING AGAINST ELECTROSTATIC DISCHARGE

(75) Inventors: Harald Gossner, München (DE); Matthias Stecher, Villach (AT); Werner Schwetlick, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/163,881

(22) Filed: Sep. 30, 1998

(30) Foreign Application Priority Data

Sep. 30, 1997 (DE) .............................................. 197 43 240

(51) Int. Cl.[7] .................................................. H01L 23/62
(52) U.S. Cl. ...................... 257/355; 257/357; 257/358; 257/359; 257/360; 257/361; 257/362; 257/363
(58) Field of Search .................... 257/355, 356, 257/357, 358, 359, 360, 361, 362, 363

(56) References Cited

U.S. PATENT DOCUMENTS

| 5,471,082 | 11/1995 | Maeda . | |
|---|---|---|---|
| 5,644,460 | 7/1997 | Clukey . | |
| 5,693,973 | * 12/1997 | Nakano et al. | 257/355 |
| 5,721,656 | * 2/1998 | Wu et al. | 361/56 |
| 5,869,870 | * 2/1999 | Lin | 257/355 |
| 5,905,288 | * 5/1999 | Ker | 257/355 |
| 5,923,068 | * 7/1999 | Lee et al. | 257/355 |
| 5,932,918 | * 8/1999 | Krakauer | 257/368 |
| 5,963,409 | * 10/1999 | Chang | 361/56 |
| 5,965,920 | * 10/1999 | Sung | 257/355 |
| 6,002,155 | * 12/1999 | Tahara et al. | 257/355 |
| 6,008,508 | * 12/1999 | Bergemont et al. | 257/175 |
| 6,016,002 | * 1/2000 | Chen et al. | 257/546 |
| 6,025,631 | * 2/2000 | Lin | 257/355 |
| 6,028,338 | * 2/2000 | Saito et al. | 257/360 |

FOREIGN PATENT DOCUMENTS

| 0 480 582 A2 | 4/1992 | (EP) . | |
|---|---|---|---|
| 0 532 481 A1 | 3/1993 | (EP) . | |
| 0 623 958 A1 | 11/1994 | (EP) . | |
| 40453161 | * 2/1992 | (JP) | 257/355 |
| 404105358 | * 4/1992 | (JP) | 257/355 |
| 404122056 | * 4/1992 | (JP) | 257/355 |
| 405121679 | * 4/1992 | (JP) | 257/355 |
| 405136328 | * 6/1993 | (JP) | 257/355 |

OTHER PUBLICATIONS

"Design and Layout of a High ESD Performance NPN Structure for Submicron BiCMOS/Bipolar Circuits" (Chen et al.), Proceedings of the IEEE International Reliability Physics Symposium, 1996.

* cited by examiner

Primary Examiner—Mahshid Saadat
Assistant Examiner—Edgardo Ortiz
(74) Attorney, Agent, or Firm—Herbert L. Lerner; Laurence A. Greenberg; Werner H. Stemer

(57) ABSTRACT

An integrated semiconductor circuit has a protection structure for protecting against electrostatic discharge. The protection element has at least one integrated vertical protection transistor, whose load path is connected between the terminal pad and a potential rail. The base of the vertical npn bipolar transistor is controlled by a diode at breakdown, whose breakdown voltage is above the holding voltage of the npn bipolar transistors. By suitably choosing the location of the base contact, of the pn junction of the breakdown diode, and of the emitter, a desired adjustment of the trigger current is possible. Thus a variation in the voltage drop at the base is achieved which enables a current flow. The signal voltage requirements can be met and at the same time, an optimization of the ESD strength is achieved. The control or trigger sensitivity of the base can also be adjusted by means of an integrated resistor, which is disposed in the base zone.

20 Claims, 4 Drawing Sheets

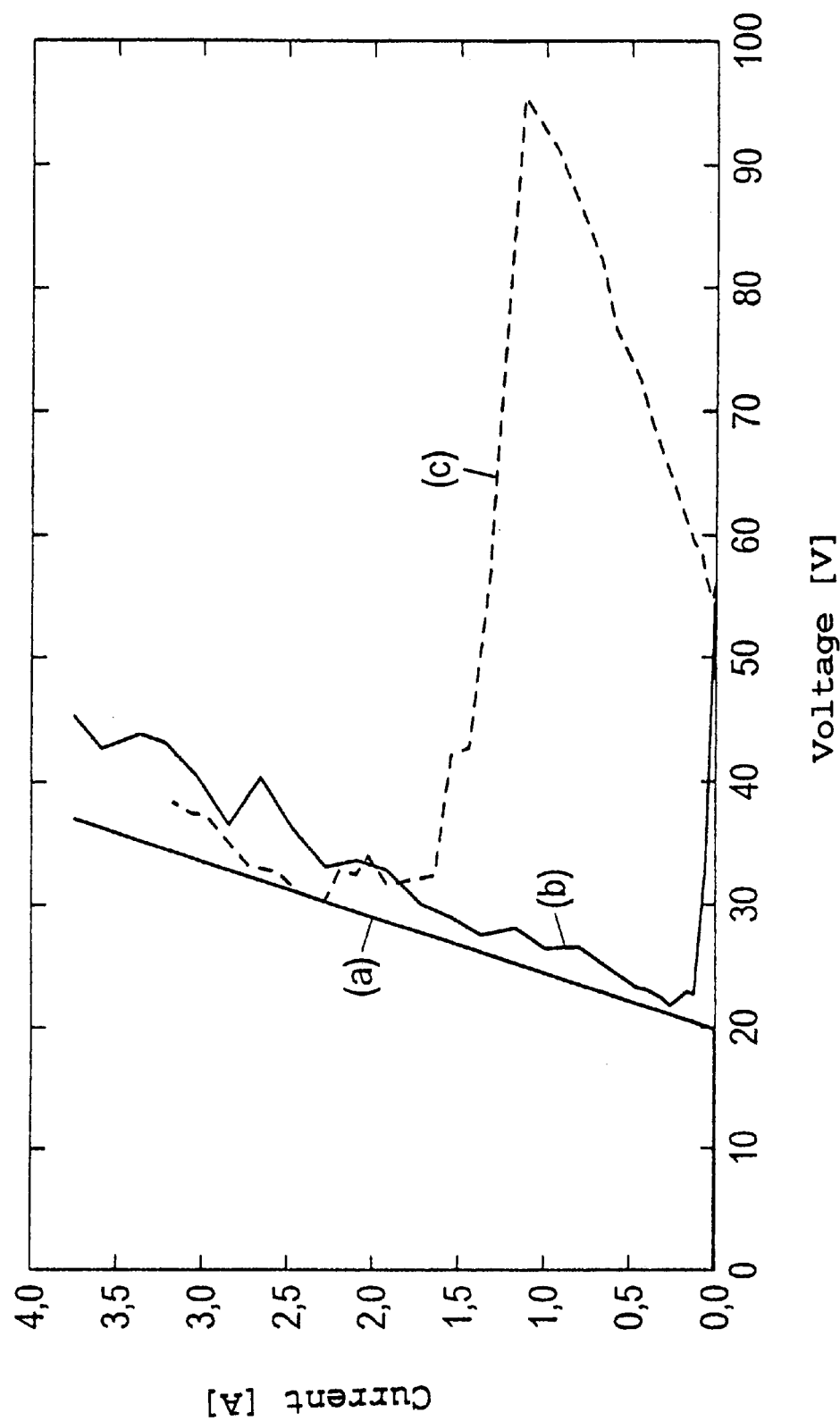

INTEGRATED SEMICONDUCTOR CIRCUIT WITH PROTECTION STRUCTURE FOR PROTECTING AGAINST ELECTROSTATIC DISCHARGE

BACKGROUND OF THE INVENTION

Field of the Invention

The invention relates to a semiconductor device disposed in at least one semiconductor body and having at least one protection element for protecting an integrated semiconductor circuit against electrostatic discharge (ESD).

One such so-called electrostatic discharge (ESD) protection element is known from the article "Design and Layout of a High ESD Performance NPN Structure for Submicron BiCMOS/Bipolar Circuits", Proceeding of the IEEE International Reliability Physics Symposium (1996), pp. 227–32, J. Chen, X. Zhang, A. Amerasekera, T. Vrotsos.

Integrated semiconductor circuits in a chip include protective circuits to protect the inputs or outputs (I/O ports) against electrostatic overvoltages and the electrostatic discharges (ESD) caused thereby. These so-called ESD protection elements are connected between the input pad of an integrated semiconductor circuit and the input or output terminal to be protected. Thus an ESD protection element assures that, when a parasitic overvoltage occurs, the ESD protection element switches, and the parasitic overvoltage pulse is diverted to one of the supply potential conductor tracks. In an extreme case, such overvoltage pulses may destroy the component.

However, under operating conditions, described for instance in the product specification, the ESD protection elements must not impair the function of the integrated semiconductor circuit to be protected. This means that the switching voltage of the ESD protection element must be outside the signal voltage range of the protected terminal pads. To provide a good protective action, the ESC protection element should break through upstream of the most-critical circuit path. As a rule, this requires an exact adjustment of the switching voltage of the respective ESD protection element, under the essential boundary condition that the process control, which has been optimized with regard to the properties of the components of the integrated semiconductor circuit to be protected, is not changed by the addition of the ESD protection elements.

Another essential condition results from the spatial disposition of the terminal pads in the immediate vicinity of the integrated semiconductor circuit to be protected. In particular, because of the relatively high current to be driven, the terminal pads are located in the vicinity of the output drivers. The ESD protection structure is therefore often connected to the supply line supplying current to the output driver.

In protection elements having a pronounced snap-back behavior, such as thyristors and bipolar transistors, rapid switch-on events or unwanted pulses can cause a switching through, even though the breakdown voltage determined by measuring the characteristic curve in the low-current range is outside the specified signal voltage range. This is also known as transient latch-up effect which generally destroys the ESD protection element. The transient latch-up occurs particularly in smart power applications.

Therefore, despite high ESD strength and good protective action, such thyristors or bipolar transistors cannot be employed as ESD protection elements because of the transient latch-up. One is thus limited to using breakdown diodes or transistors with low gain. Yet these components have a much lower ESD strength.

For further details, characteristics, advantages and the modes of operation of ESD protective circuits, Published European Patent Application EP 0 623 958 A1 and the aforementioned paper by J. Chen et al. are hereby incorporated by reference in their entirety.

SUMMARY OF THE INVENTION

It is accordingly an object of the invention to provide a semiconductor device for ESD protection which overcomes the above-mentioned disadvantages of the heretofore-known protection devices of this general type and which has an adjustable trigger current.

With the foregoing and other objects in view there is provided, in accordance with the invention, a semiconductor device, comprising a semiconductor body; an integrated semiconductor circuit in the semiconductor body; a terminal pad; an electrically conductive connecting line connecting the terminal pad to the integrated semiconductor circuit; a first potential rail carrying a first supply potential during an operation of the integrated semiconductor circuit; a second potential rail carrying a second supply potential during the operation of the integrated semiconductor circuit; a protection element for protecting the integrated semiconductor circuit against an electrostatic discharge connected between the terminal pad and the integrated semiconductor circuit and connected to at least one of the first and the second potential rails; the protection element including an integrated vertical protection transistor having a base and having a load path connected between the electrically conductive connecting line and one of the first and second potential rails, a control device controlling the base, and a current carrying configuration dividing a parasitic current pulse into a horizontal component and a vertical component.

In accordance with another feature of the invention, a buried layer of a first conductivity type is formed in the semiconductor body; an epitaxial layer of a first conductivity type includes a base zone of a second conductivity type, the base zone being formed in a partial region of the epitaxial layer spaced apart from the buried layer, the base zone having a given dopant concentration and serving as the base; an emitter zone of the first conductivity type formed in the base zone; a base contact zone of a second conductivity type formed in the base zone and having a dopant concentration greater than the given dopant concentration of the base zone; a base drift zone of the second conductivity type provided between the base zone and the buried layer; and wherein the protection transistor has an emitter and a collector, the emitter zone serves as the emitter and the buried layer serves as the collector.

In accordance with another feature of the invention, the current carrying configuration is defined by a horizontal disposition of the base drift zone relative to the base contact zone and the emitter zone.

In accordance with a further feature of the invention, the control device includes an integrated diode connected in a reverse direction and disposed between the buried layer and the base drift zone.

In accordance with yet another feature of the invention, the control device includes an integrated resistor.

In accordance with another feature of the invention, the integrated resistor has a conductance value defined by the given dopant concentration in the base zone.

In accordance with a further feature of the invention, the base drift zone has a dopant concentration and a thickness, and the protection element has a switching voltage defined by the dopant concentration of the base drift zone and by the thickness of the base drift zone.

In accordance with yet another feature of the invention, a terminal zone is connected to the buried layer and to one of the first and second potential rails.

In accordance with a further feature of the invention, the terminal zone is disposed annularly around the base zone and/or the base drift zone.

In accordance with another feature of the invention, the terminal zone is spaced apart equidistantly by a given distance from the base zone and/or the base drift zone.

In accordance with a further feature of the invention, the buried layer and the partial region each have a lateral cross-sectional area, the lateral cross sectional area of the buried layer being greater than the lateral cross-sectional area of the partial region.

In accordance with yet another feature of the invention, the emitter zone has a dopant concentration being higher than the dopant concentration of the base zone.

In accordance with another feature of the invention, an anode zone provided between the buried layer and the terminal pad.

A semiconductor device according to the invention has the following characteristics:

a) at least one terminal pad, which is connected to an integrated semiconductor circuit via an electrically conductive connecting line, b) at least one first potential rail, which in operation carries a first supply potential of the integrated semiconductor circuit, c) at least one second potential rail, which in operation carries a second supply potential of the integrated semiconductor circuit, d) having at least one protection element for protecting the integrated semiconductor circuit against electrostatic discharge, the protection element being disposed between the terminal pad and the integrated semiconductor circuit and being connected to at least one of the potential rails, e) the protection element having at least one integrated vertical protection transistor, whose load path is connected between the connecting line and one of the potential rails and whose base is controlled via a control device, and f) the protection element has means for carrying a current, and by the means for carrying a current a parasitic current pulse is split into a horizontal component and a vertical component.

According to the invention, vertical npn bipolar transistors are used as ESD protection elements. Their base is controlled or triggered by a diode at breakdown whose switching voltage is above the holding voltage of the npn bipolar transistors. The current carrying properties and thus the voltage drop in the base of the npn transistor can be varied by a suitable choice of the location of the base contact. This enables a specific adjustment of the trigger current. It is also possible to omit the base contact or Schottky contact in the base zone. Thus the signal voltage requirement can be met and the ESD strength can be optimized.

The invention is especially advantageous if the protection transistor is triggered by a diode connected in the reverse direction. Particularly when the base is connected to a diode whose breakdown is in the range of the holding voltage of the protection transistor. As a result, an almost ideal ESD protection element can be developed that has an adjustable voltage limitation up to the range of amperes between the upper limit for the signal voltage and the holding voltage. The switching voltage of the protection element can be adjusted by means of the anode-side dopant concentration and by the anode-side thickness of the drift zone of the diode.

It is especially advantageous if an integrated resistor is provided between the emitter and base terminals of the protection transistor. The integrated resistor allows adjustment of the control or triggering sensitivity of the base of the protection transistor. When the emitter and base terminals are suitably connected, the integrated resistor is typically defined by the conductance value of the base zone.

The buried layer is connected to the terminal pad via a terminal zone, which for the sake of good conductivity is doped as highly as possible. The terminal zone defines a partial region in which the protection elements are disposed. The partial region is typically disposed in an epitaxial layer. It is especially advantageous if the terminal zone is disposed annularly as a closed ring around the partial region.

The terminal zones are spaced apart equidistantly by a second distance from the base zones and/or the second emitter zones. The second distance should typically be selected to be sufficiently large so that the parasitic bipolar transistor in the peripheral region of the partial zone does not switch through.

Typically, the lateral cross-sectional area of the buried layer is greater than the lateral cross-sectional area of the terminal zone and the partial region. The partial region is typically disposed in an epitaxial layer of the semiconductor body.

The emitter zones typically have a dopant concentration that is much higher than that of the base zones or the epitaxial layer. The dopant concentration in the epitaxial layer is often defined by the process control in the production of the integrated circuit.

The buried layer and the terminal zones are doped with a high concentration of dopants, in order to meet the demands for a high conductance value. Typically, these zones have a dopant concentration of more than $1 \times 10^{19}$ cm$^{-3}$.

It is also conceivable to provide an anode zone between the collector terminal and the terminal pad. In that case, the ESD protection element is embodied as an IGBT or as a thyristor.

The invention is especially advantageous when used in a semiconductor memory or a logic component. Another advantageous application of the invention is its use in a microcontroller.

Typically, the invention is integrated into circuits embodied in bipolar fashion. The switching transistor may be an npn bipolar transistor, and the control or trigger transistor may be a pnp bipolar transistor. However, it is especially advantageous if the integrated semiconductor circuit and the ESD protection element are both manufacture in CMOS technology. In that case, the switching transistor is an n-channel MOSFET, for instance, and the control transistor a p-channel MOSFET.

Other features which are considered as characteristic for the invention are set forth in the appended claims.

Although the invention is illustrated and described herein as embodied in a semiconductor device with a protection element for protecting against an electrostatic discharge, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 illustrates high-current characteristic curves of a real diode (a) and an ESD protection element with a low trigger current (b) and with a high trigger current (c).

DESCRIPTION OF THE PREFERRED EMBODIMENTS

Figure 1:
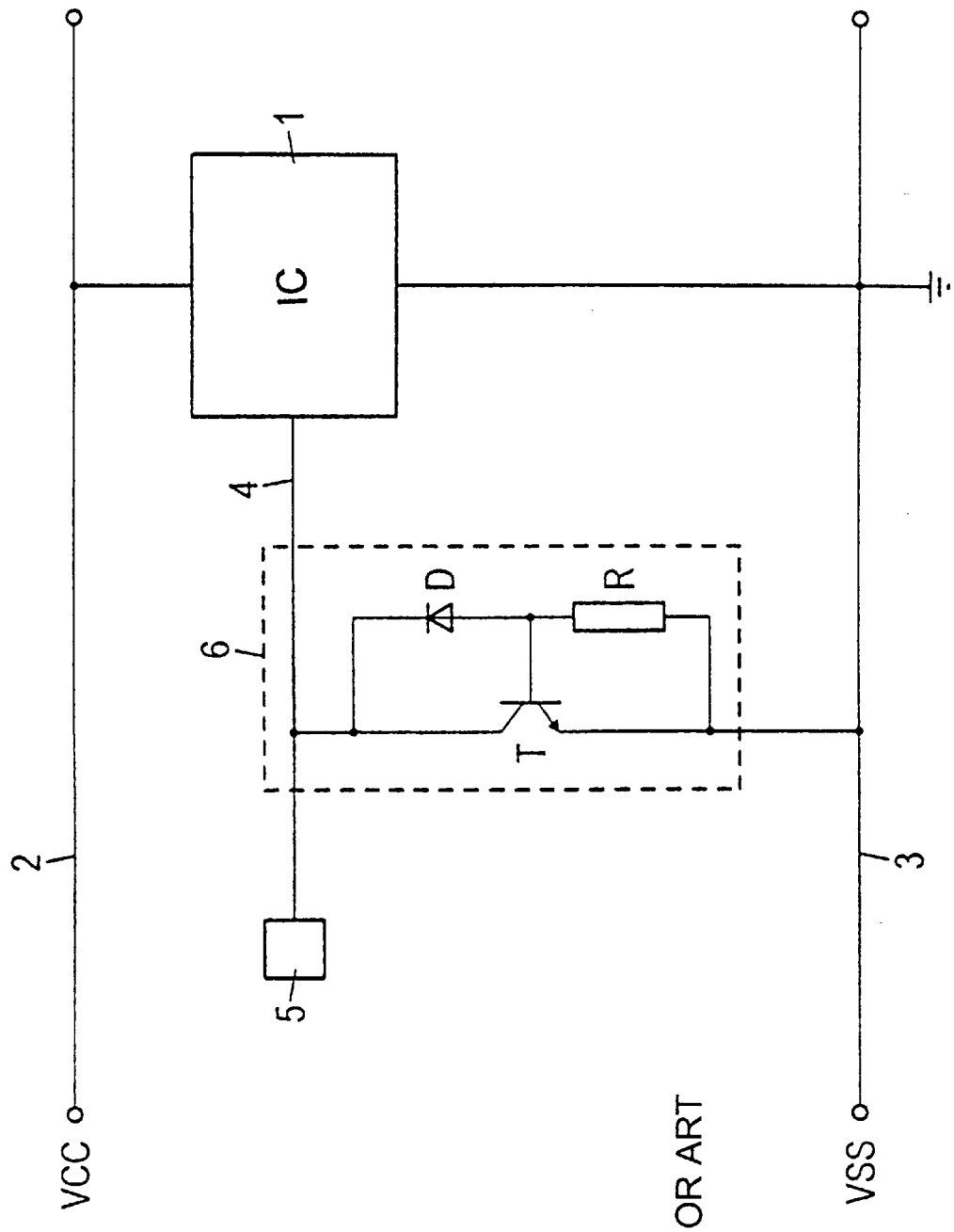
FIG. 1 illustrates a circuit configuration of a known integrated semiconductor circuit preceded by an ESD protection element.

Referring now to the figures of the drawings in detail and first, particularly, to FIG. 1 thereof, there is shown a circuit configuration of a known integrated semiconductor circuit preceded by an ESD protection element.

In FIG. 1, the integrated semiconductor circuit is denoted by reference numeral 1. The integrated semiconductor circuit 1 is connected to a first potential rail 2 having a first supply potential VCC and to a second potential rail 3 with a second supply potential VSS. The first supply potential VCC may for instance be the supply voltage. The second supply potential VSS may, as in the present example, be the reference ground.

Via a connecting line 4, the integrated semiconductor circuit 1 is connected to a terminal pad 5. The terminal pad 5 may be an input terminal for coupling in input signals into the integrated semiconductor circuit 1 and an output terminal for coupling out output signals from the integrated semiconductor circuit 1. Such terminals are also known as I/O ports.

An ESD protection element 6 is connected between the terminal pad 5 and the integrated semiconductor circuit 1. The ESD protection element 6 is also connected to the second potential rail 3.

In the present example, the ESD protection element 6 comprises an npn protection transistor T, whose load path is connected between the connecting line 4 and the potential rail 3. It would also be conceivable to use a pnp transistor as the protection transistor T. However, this depends on the fundamental technology employed to produce the integrated semiconductor circuit 1. Of course it would also be conceivable to realize the protection transistor T alternatively as a MOSFET, a depletion layer FET, a thyristor, an IGBT, or any other controllable component that is connected in a suitable manner.

A diode D is provided between the base-to-collector path of the protection transistor T. A resistor R is provided between the base-to-emitter path of the protection transistor T. In the present example, the base terminal of the protection transistor T is actively controlled or triggered by the diode D connected in the reverse direction. The control or trigger voltage of the protection transistor T can be adjusted via suitable dimensioning of the resistor R. However, it is also conceivable that the protection transistor T is not actively controlled or triggered. In that case, the diode D is dispensable.

In the present example, the ESD protection element 6 is connected between the connecting line 4 and the second potential rail 3. Naturally, it would also be conceivable to dispose the ESD protection element 6 between the connecting line 4 and the first potential rail 2, or between the connecting line 4 and both potential rails 2, 3.

The ESD protection element 6 is intended to protect the integrated semiconductor circuit 1 against parasitic unwanted signals or disturbance signals coupled in via the terminal pad. These parasitic unwanted signals are diverted via the ESD protection element 6 to one of the potential rails 2, 3 and thus do not enter the integrated semiconductor circuit 1.

Such unwanted signals may occur for instance during transport or handling of the semiconductor chip. The semiconductor chip may get charged electrostatically. If the electrostatic charge is coupled or fed into the integrated semiconductor circuit 1, the integrated semiconductor circuit 1 may be damaged or even destroyed in extreme cases.

To simulate the feeding or coupling in of unwanted signals, the so-called human body model (HBM) is typically used. The equivalent circuit diagram of the human body model provides a low-pass filter, comprising a 100 pF capacitor and a 1.5 kOhm resistor. The human body model simulates an unwanted signal coupled in by a human being. It is also conceivable to use other models, such as the so-called charged-device model (CDM).

Figure 2:
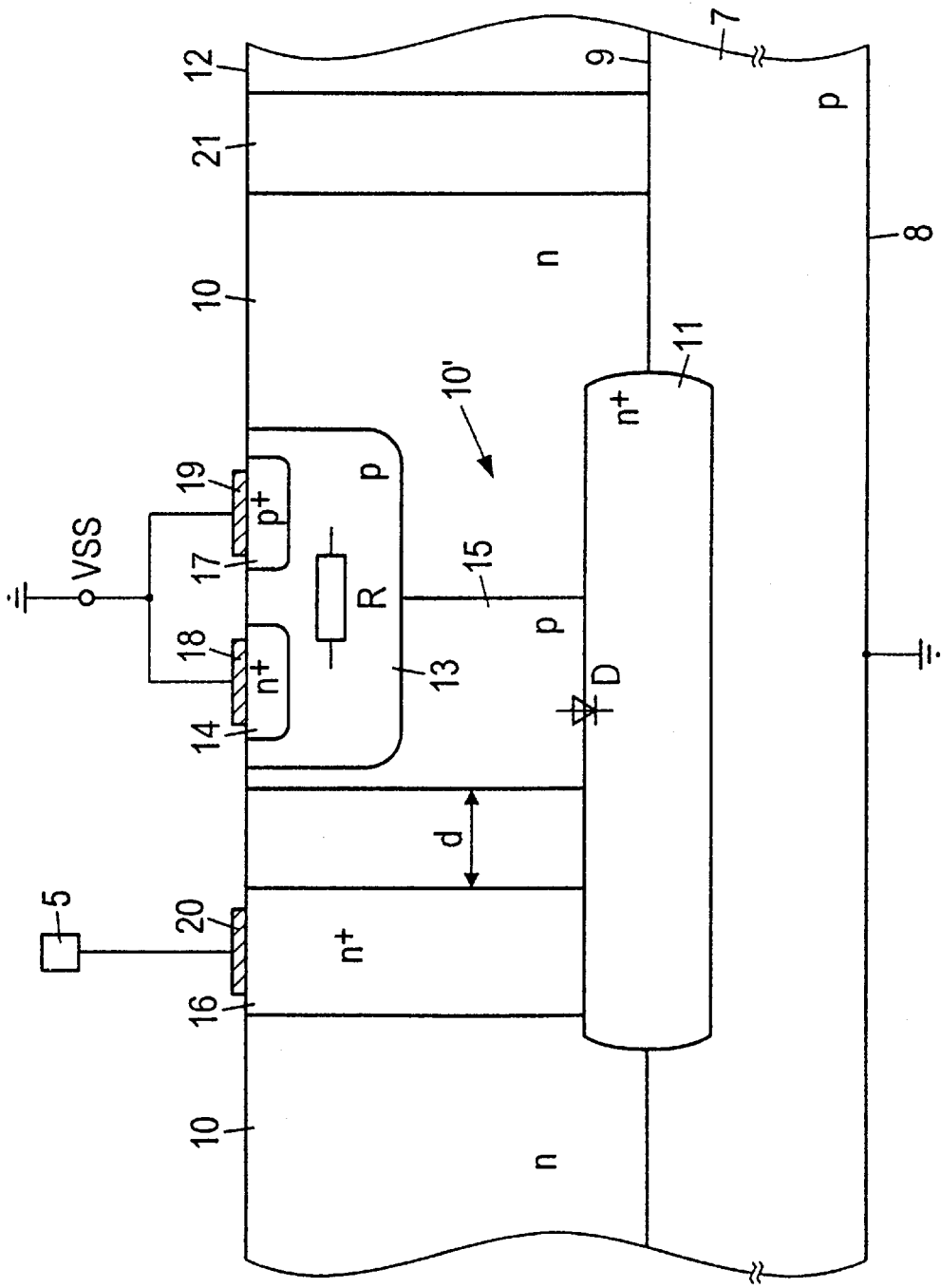
FIG. 2 is a schematic illustration of an embodiment of an ESD protection structure according to the invention in a semiconductor system having a low trigger current.
Figure 3:
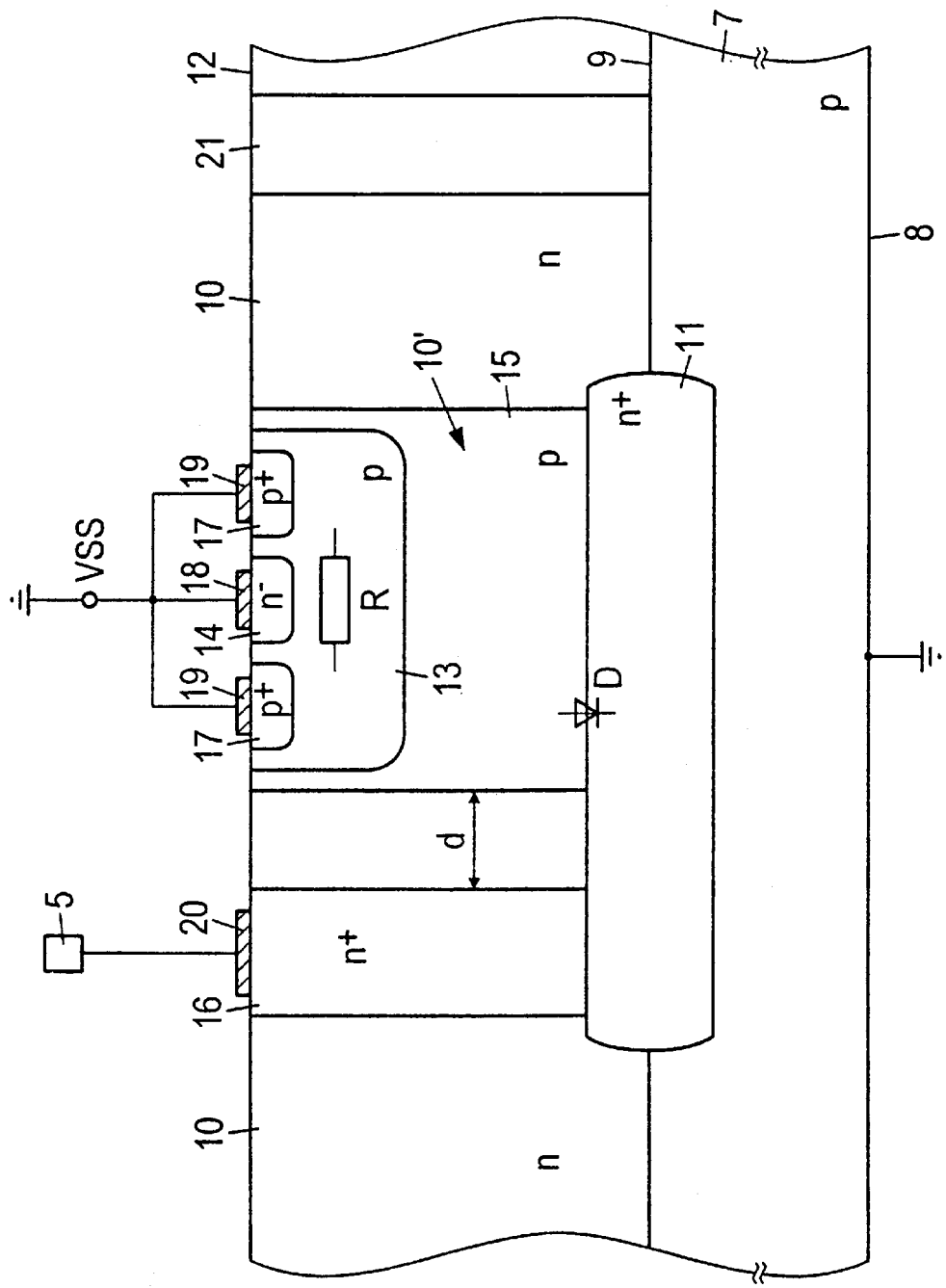
FIG. 3 is a schematic illustration of an embodiment of an ESD protection structure according to the invention in a semiconductor system having a high trigger current.

FIGS. 2 and 3 each show a schematic illustration for embodying an ESD protection element according to the invention with a low or a high trigger current. Identical elements are provided with the same reference numerals as in FIG. 1.

In FIGS. 2 and 3, reference numeral 7 indicates a semiconductor body. The semiconductor body 7 comprises a silicon substrate. The semiconductor body 7 has a wafer back side 8 and a substrate surface 9. The wafer back side 8 may for instance be at the reference potential, via a commonly used large-area metallization. In the present example, the silicon substrate of the semiconductor body 7 is p-doped and the wafer back side 8 is at the potential of the ground reference. The semiconductor substrate may of course also be n-doped.

An epitaxial layer 10, being n-doped with a low concentration of dopants, is applied on the substrate surface 9 of the semiconductor body 7. As far as the function of the ESD protection structure is concerned, it would also be conceivable to provide a plurality of epitaxial layers 10 one above the other, or to dispense with the epitaxial layer 10 entirely. The dopant concentration in the epitaxial layer 10 is defined by the process control used to produce the integrated semiconductor circuit 1. Typically, the epitaxial layer has a dopant concentration of $1 \times 10^{15}$ cm$^{-3}$ to $1 \times 10^{18}$ cm$^{-3}$. The thickness of the epitaxial layer depends on the structures of the integrated circuit 1 to be protected, the structures being dependent on the technology used.

A buried layer 11 is additionally provided, as shown in FIG. 2. In the present example, the buried layer 11 is n$^{+}$-doped. The buried layer 11 may be created for instance by placing a deposit on the substrate surface 9 before the growth of the epitaxial layer 10 followed by a diffusion at a suitable temperature.

However, it also advantageous if the buried layer 11 is created by ion implantation into the semiconductor body 7 after or during the growth of the epitaxial layer 10. The desired vertical profile may be achieved by a multiple implantation at suitable energy levels and dopant doses. This should be followed by a temperature step for the sake of a homogeneous distribution of the dopant atoms in the diffusion zone 9.

The dopant concentration in the buried layer 11 is often specified by the process control in the production of the integrated circuit 1. The buried layer 11 is embodied with an impedance as low as possible and has a typical dopant concentration of approximately $10^{19}$ cm$^{-3}$. The distance or spacing between the buried layer 11 and the wafer surface 12 varies between 1 and 10 μm, depending on the technology on which the manufacturing process is based.

The buried layer 11 is connected via a terminal zone 16 to the wafer front side 12 of the semiconductor body 1. The terminal zone 16 is of the same conductivity type as the buried layer 11 and typically has a very high dopant concentration of more than $1 \times 10^{19}$ cm$^{-3}$. In the present example the terminal zone 16 extends from the wafer surface 12 into the semiconductor body 7 and is connected to the buried layer 11. The terminal zone 16 is embodied here as a deep implantation layer. However, it would also be conceivable to provide the terminal zone in the form of a trench, which can be manufactured with known trench technologies.

The buried layer 11 on the one hand and the terminal zones 16 on the other include a so-called partial region 10' of the epitaxial layer 10.

In the partial region 10', a base zone 13 is disposed on the wafer surface 12. In the present exemplary embodiment, the base zone 13 is p-doped and embodied in the form of a well. A well-shaped emitter zone 14 of the opposite conductivity type is also disposed on the wafer surface 12, inside the base zone 13. The emitter zone 14 typically has a dopant concentration of about $5 \times 10^{19}$ cm$^{-3}$, while the base zone 13 has a typical dopant concentration of $10^{16}$ to $10^{17}$ cm$^{-3}$.

In addition, as shown in FIGS. 2 and 3, p$^+$-doped base contact zones 17 may be provided in the base zones 13. The base contact zones are of the same conductivity type as the base zones, but they have a much higher dopant concentration, typically $5 \times 10^{19}$ cm$^{-3}$. The base contact zones 17 provide a defined electrical contact between external terminals and the base zone 13.

The base zone 13, the emitter zone 14, and the terminal zone 16 are contacted via conventional contact means 18, 19, 20 on the wafer surface 12. The contact electrodes 18 of the emitter zones 14, and the contact electrodes 19 of the base zone 13 are respectively short-circuited and connected to the second potential rail 3 and thus to the ground reference. The contact electrodes 20 of the terminal zones 16 are connected to the terminal pad 5.

A p-doped base drift zone 15 is provided between the base zone 13 and the buried layer. The base drift zone 15 is of the same conductivity type as the base zone 13 and can be manufactured for instance by ion implantation. The dopant concentration of the base drift zone 15 depends on the desired switching voltage of the ESD protection structure.

The equivalent circuit diagram of an ESD protection element 6, shown in FIG. 1, with a protection transistor T, as well as a diode D and a resistor R for controlling the base of the protection transistor T, applies for the structures shown in FIGS. 2 and 3. The emitter zone 14, the base zone 13, and the buried layer 11 form the emitter, the base and the collector, respectively, of the protection transistor T. For the sake of simplicity and clarity, the substitute circuit diagram of FIG. 1 is not shown in FIGS. 2 and 3. Only the location of the integrated resistor R and the integrated diode D is indicated in FIGS. 2 and 3.

The interconnections shown in FIGS. 2 and 3 illustrate that the integrated resistor R results from the dopant concentration in the base zone 13 between adjacent contact zones of the emitter zone 14 and the base contact zone 17. An integrated diode D is indicated in FIGS. 2 and 3 between the base drift zone 15 and the buried layer 11. The diodes D and the resistor R control the base of the protection transistor T. The conductance value of the resistor R determines the control sensitivity. The transistor T switches through more easily when the chosen conductance value of the resistor R is increased. The dopant concentration in the base drift zone 15 and the spacing of the base zone 13 from the buried layer 11 determine the breakdown voltage of the diode D and thus of the protection transistor T.

The mode of operation of the ESD protection structure of the invention as shown in FIGS. 2 and 3 will now be described in further detail below.

If an unwanted signal is coupled in via the terminal pad 5 and if this signal exceeds the switching threshold of the protection transistor T, then the diode D between the buried layer 11 and the base drift zone 15 is operated at breakdown.

At the same time, the breakdown current controls the base of the protection transistor T in such a way that, given an adequately high base current, the protection transistor T is made conducting. This creates a current path from the terminal pad 5 to the emitter zone 14 and thus to the second potential rail 3, via the terminal zones 16, the buried layer 11, the base drift zone 15, and the base zone 13. The unwanted signal is thus diverted to the second potential rail 3 and does not reach the integrated semiconductor circuit 1.

The exemplary embodiments shown in FIGS. 2 and 3 differ from one another in the placement of the base drift zone 15 in the partial region 10'. The trigger current of controlled npn bipolar transistors can be adjusted as desired by a suitable disposition of the base drift zone 15 relative to the base zone 13 as well as the highly doped contact regions of the emitter zone and the base contact zone 17. The desired dU/dt switch-on behavior can be achieved by means of the specific adjustment of the trigger current.

In FIG. 2, the base drift zone 15 is disposed essentially vertically below the emitter contact 14 of the protection transistor T. In the exemplary embodiment, the base contact 17 of the protection transistor and thus also the anode of the diode D are disposed in a region of the base zone 13 that is also disposed above the base drift zone 15 and is additionally shifted horizontally.

The fundamental concept is as follows: if because of the placement of the base contact 17 or the anode of the diode D a large proportion of the diode current in breakdown must flow through the base zone 13 of the npn bipolar transistor, then a relevant voltage drop occurs there. In that case, the snap-back occurs already at low trigger currents. If the base contact 17 is placed such that the predominant proportion of the diode current flows away essentially vertically, thus causing only a slight voltage drop at the base, then high trigger currents are achieved.

In FIG. 3, conversely, the base drift zone 15 wraps around the entire base zone 13. Here the current course essentially has a vertical component, while the horizontal component is negligible. Thus the voltage drop at the base zone 13 is minimal here, which leads to high trigger currents.

FIG. 4 shows the high-current characteristic curve of an ESD protection element with a low trigger current (b) and a high trigger current (c).

Ideally, the ESD protection element should have the switching behavior of a real diode corresponding to curve (a). In practice, however, this behavior is unattainable in generic ESD protection elements. In reality, these protection elements have a characteristic curve corresponding to (b) and (c).

The characteristic curve (b) illustrates the high-current characteristic curve of an ESD structure with low trigger currents corresponding to FIG. 2. This protection element has a voltage limitation at low values and thus good protective effectiveness. With rapid voltage pulses in normal operation, however, this protection element may switch through unintentionally. This occurs especially if a signal intended for the integrated circuit 1, for instance, has slight jitter with fast switch-on edges or a slightly elevated voltage pulse that is above the switch-through threshold. In that case, this signal is unintentionally diverted via the ESD protection element.

The characteristic curve (c) illustrates the high-current characteristic curve of an ESD structure having high trigger currents as is shown in FIG. 3. This characteristic curve has a pronounced snap-back behavior. This protection element limits the voltage at increased values and thus exhibits a reduced protective action. However, the risk of an unintended switching through is reduced.

Depending on the specific technology and the demands made on the integrated circuit, an ESD protection element according to the invention whose characteristic curve is located approximately between curves (b) and (c) can thus advantageously be realized. Such a characteristic curve then combines the advantages of the ESD protection elements with a low and a high trigger current.

In the projected plan view (not shown), both the buried layer 11 and the partial region 10' have an annular structure. However, the annular structure need not necessarily be closed. The annular structure may be embodied in circular, rectangular or polygonal fashion. Alternatively, a ribbonlike structure is also conceivable. Typically, the lateral cross-sectional area of the buried layer 11 is at least greater than the lateral cross-sectional area of the partial region 10'.

The base zone 13 and the base drift zone 15 are disposed in the partial region 10' in such a way that they are spaced apart from the terminal zone 16 by a distance d. The distance d should be selected to be large enough that the lateral, parasitic pn diode in the peripheral region of the partial region 10' adjoining the terminal zone 16 is suppressed. In smart power technology (SPT), this distance is typically greater than 20 μm.

The base zone 13, the emitter zone 14, and the base contact zones 17 are embodied as wells in the present example. However, V-shaped, U-shaped, trenchlike or similar structures would also be conceivable. These zones 13, 14, 17 are advantageously made by diffusion or ion implantation into the semiconductor body 7. Alternative production methods, such as deposition or the like, are also conceivable, however.

In addition, as indicated in FIGS. 2 and 3, a buffer zone 21 may be provided. In the exemplary embodiment, the buffer zone 21 extends from the front side 12 of the wafer through the entire epitaxial layer 10 as far as the substrate surface 9 and is connected to the semiconductor body 7. The buffer zone 21 typically has the function of shielding or separating the ESD protection element 6 from the integrated semiconductor circuit 1 or semiconductor chip.

The buffer zone 21 can be formed by any common buffer material, such as silicon dioxide, silicon nitride, or the like.

However, it is advantageous if the buffer zone 21 comprises $p^+$-doped silicon. In that case, the pn diode polarized in the flow direction between the buried layer 11 and the p-doped substrate 7 can be utilized to divert negative pulses, for instance. These negative pulses can then be diverted via the $p^+$-doped buffer zone 21.

It is also advantageous if an additional anode zone having a conductivity type opposite that of the terminal zone 16 is provided between the buried layer 11 and the terminal pad 5. In that case, the ESD protection element 6 may also be embodied as an IGBT or a thyristor.

The invention is especially advantageous when the ESD protection element is used in a microcontroller, a semiconductor memory, or a logic component.

Both the integrated semiconductor circuit and the associated ESD protection element are preferably realized in bipolar fashion or manufactured in smart power technology. In particular it is also advantageous if both the integrated semiconductor circuit 1 and the ESD protection circuit are manufactured in CMOS technology.

What is claimed is:

1. A semiconductor device, comprising:

a semiconductor body;

an integrated semiconductor circuit in said semiconductor body;

a terminal pad;

an electrically conductive connecting line connecting said terminal pad to said integrated semiconductor circuit;

a first potential rail carrying a first supply potential during an operation of said integrated semiconductor circuit;

a second potential rail carrying a second supply potential during the operation of said integrated semiconductor circuit;

a protection element for protecting said integrated semiconductor circuit against an electrostatic discharge connected between said terminal pad and said integrated semiconductor circuit and connected to at least one of said first and said second potential rails; said protection element including an integrated vertical protection transistor having a base and having a load path connected between said electrically conductive connecting line and one of said first and second potential rails, a control device controlling said base, and a current carrying configuration dividing a parasitic current pulse into a horizontal component and a vertical components;

a buried layer of a first conductivity type formed in said semiconductor body;

an epitaxial layer of a first conductivity type including a base zone of a second conductivity type, said base zone being formed in a partial region of said epitaxial layer spaced apart from said buried layer, said base zone having a given dopant concentration and serving as said base;

an emitter zone of the first conductivity type being formed in said base zone;

a base contact zone of a second conductivity type being formed in said base zone and having a dopant concentration greater than the given dopant concentration of said base zone; and a base drift zone of the second conductivity type provided between said base zone and said buried layer;

said protection transistor having an emitter and a collector, said emitter zone serves as said emitter and said buried layer serves as said collector.

2. The semiconductor device according to claim 1, wherein said current carrying configuration is defined by a horizontal disposition of said base drift zone relative to said base contact zone and said emitter zone.

3. The semiconductor device according to claim 1, wherein said control device includes an integrated diode connected in a reverse direction and disposed between said buried layer and said base drift zone.

4. The semiconductor device according to claim 1, wherein said control device includes an integrated resistor.

5. The semiconductor device according to claim 4, wherein said integrated resistor has a conductance value defined by the given dopant concentration in said base zone.

6. The semiconductor device according to claim 1, wherein said base drift zone has a dopant concentration and a thickness, and said protection element has a switching voltage defined by the dopant concentration of said base drift zone and by said thickness of said base drift zone.

7. The semiconductor device according to claim 1, comprising a terminal zone connected to said buried layer and to one of said first and second potential rails.

8. The semiconductor device according to claim 7, wherein said terminal zone is disposed annularly around said base zone.

9. The semiconductor device according to claim 7, wherein said terminal zone is disposed annularly around said base drift zone.

10. The semiconductor device according to claim 8, wherein said terminal zone is spaced apart equidistantly by a given distance from said base zone.

11. The semiconductor device according to claim 9, wherein said terminal zone is spaced apart equidistantly by a given distance from said base drift zone.

12. The semiconductor device according to claim 7, wherein said terminal zone is spaced apart equidistantly by a given distance from said base zone and from said base drift zone.

13. The semiconductor device according to claim 1, wherein said buried layer and said partial region each have a lateral cross-sectional area, said lateral cross sectional area of said buried layer being greater than said lateral cross-sectional area of said partial region.

14. The semiconductor device according to claim 1, wherein said emitter zone has a dopant concentration being higher than the dopant concentration of said base zone.

15. The semiconductor device according to claim 7, wherein said terminal zone has a dopant concentration of at least $1 \times 10^{19}$ cm$^{-3}$.

16. The semiconductor device according to claim 1, wherein said buried layer (11) has a dopant concentration of at least $1 \times 10^{19}$ cm$^{-3}$.

17. The semiconductor device according to claim 1, comprising an anode zone provided between said buried layer and said terminal pad.

18. In combination with a semiconductor memory, the protection element of claim 1.

19. In combination with a logic component, the protection element of claim 1.

20. In combination with a microcontroller, the protection element of claim 1.

* * * * *